US 7,154,735 B2

(12) United States Patent
Matters-Kammerer

(10) Patent No.: US 7,154,735 B2
(45) Date of Patent: Dec. 26, 2006

(54) DECOUPLING MODULE FOR DECOUPLING HIGH-FREQUENCY SIGNALS FROM A POWER SUPPLY LINE

(75) Inventor: Marion Kornelia Matters-Kammerer, Limbricht (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 93 days.

(21) Appl. No.: 10/515,467

(22) PCT Filed: May 13, 2003

(86) PCT No.: PCT/IB03/01855

§ 371 (c)(1),
(2), (4) Date: Nov. 22, 2004

(87) PCT Pub. No.: WO03/100800

PCT Pub. Date: Dec. 4, 2003

(65) Prior Publication Data
US 2006/0007632 A1    Jan. 12, 2006

(30) Foreign Application Priority Data
May 24, 2002   (DE) ................................ 102 23 295

(51) Int. Cl.
*H01G 4/228* (2006.01)

(52) U.S. Cl. ................ 361/306.2; 361/312; 361/306.3; 361/311; 361/313; 361/321.1; 361/321.2

(58) Field of Classification Search .. 361/306.1–306.3, 361/763, 767, 782, 311–313, 321.1, 321.2, 361/321.5
See application file for complete search history.

(56) References Cited

U.S. PATENT DOCUMENTS

| 6,038,122 A | 3/2000 | Bergstedt et al. |
| 6,472,737 B1 * | 10/2002 | Corisis et al. ............. 257/691 |
| 6,700,794 B1 * | 3/2004 | Vinson et al. ............. 361/782 |
| 6,760,232 B1 * | 7/2004 | Smith et al. ................ 361/780 |
| 6,770,969 B1 * | 8/2004 | Mosley ....................... 257/724 |
| 6,775,150 B1 * | 8/2004 | Chakravorty et al. ....... 361/761 |
| 6,847,527 B1 * | 1/2005 | Sylvester et al. ........... 361/763 |

* cited by examiner

Primary Examiner—Nguyen T. Ha

(57) ABSTRACT

A decoupling module for decoupling high-frequency signals from A power supply line, the module including a layer (30) of dielectric material which is arranged between a first and a second metallic layer (20, 22), where the first metallic layer (20) is connected as a ground electrode of the decoupling module and the second metallic layer (22) includes at least two surfaces of different size which are consecutively electrically connected between an input connection point and an output connection point, while two respective consecutive surfaces are connected to each other by only one conducting section.

10 Claims, 10 Drawing Sheets

DECOUPLING MODULE FOR DECOUPLING HIGH-FREQUENCY SIGNALS FROM A POWER SUPPLY LINE

FIELD OF THE INVENTION

The invention relates to a decoupling module for decoupling high-frequency signals from a power supply line, the module comprising a layer of dielectric material which is arranged between a first and a second metallic layer, the first metallic layer being connected as a ground electrode of the decoupling module.

BACKGROUND AND SUMMARY OF THE INVENTION

The design of high-frequency circuits as they are used in mobile communication nowadays is a highly complex and time-consuming process. Besides the high-frequency behavior, also the DC voltage supply of the active components is to be optimized. There are often undesired couplings between the electric components and lines, which undesired couplings cannot be taken into account during the design process and are not recognized until the end of the development of a high-frequency module.

To be able to amplify the high-frequency signals, the active components are also to be connected to the central battery voltage from which they draw the necessary energy. A known problem at the end of the design process is the crosstalk of high-frequency signals on the lines of the battery voltage supply. This coupling effect leads to feedback loops between the active components. Their behavior is then disturbed considerably by this effect and the whole high-frequency circuit may end up in producing undesired resonance.

Launching the high-frequency signals in the voltage supply lines can often not be avoided. In order to nevertheless avoid crosstalk of signals from one active component to others, the high-frequency signals from these lines are leaked to ground via a decoupling module. This decoupling module is to allow all the high-frequency signals to pass to ground, but not influence the DC voltage. In principle this is done by capacitors, because no DC current can flow through them so that the DC voltage of the battery remains unaffected. For the high-frequency signal the capacitor offers an impedance Z which decreases with frequency:

$$Z = \frac{1}{j\omega C}, \quad (1)$$

where:

$\omega = 2\pi f$ with f as the frequency of the high-frequency signal;

C is the capacitance of the capacitor; and $j = \sqrt{-1}$. The higher the frequency of the signal, the simpler the signal is to be led to ground via the capacitor.

In many high-frequency circuits a large number of the discrete ceramic multilayer capacitors are used for decoupling the undesired high-frequency signals from the DC voltage lines, which capacitors are soldered onto the high frequency module. The one contact of the capacitors is connected to the voltage supply line, the other to the ground line. A disadvantage of these capacitors is the self-inductance L induced by its inner structure. The combination of the capacitance C and the inductance L leads to the fact that the effective decoupling capacitance decreases with frequency and is zero at the frequency $$f_{C=0} = \frac{1}{2\pi\sqrt{L \cdot C}} \quad (2)$$

At frequencies beyond $f_{c=0}$, these capacitors function as a coil and decoupling is then no longer guaranteed. If these capacitors are used, often no satisfactory decoupling is reached in the first design, and further time-consuming designs are necessary until the module works.

To reduce the self-inductance, one-layer capacitors have been developed. To achieve a sufficiently high capacitance, either the layer thickness is kept very small (down to about 20 nm) or a material is chosen that has a high dielectric constant. Due to the very much smaller self-inductance, the frequency $f_{c=0}$ is considerably higher and the decoupling of the high-frequency signal from the voltage supply line works up to high frequencies. A disadvantage is that the one-layer capacitors are to be mounted as discrete components in many applications. Furthermore, the manufacture and contacting of thin films takes place only in very special and costly processes. The materials used have a relatively high breakdown field strength of about 200 V/μm for typical thin-film ceramics up to 1000 V/μm for silicon nitride. With very thin layers of about 20 nm for the silicon nitride this means that the breakdown field strength is reached at about 20 V. With typical layer thicknesses in the range of 0.5 μm of thin film ceramic capacitors the breakdown voltage is found at about 100 V. These capacitors cannot thus be used in high voltage-ranges.

Capacitors are predominantly used in most high-frequency circuits to guarantee that no resonance occurs.

U.S. Pat. No. 6,038,122 proposes a decoupling capacitor which has a progressive capacitance from one connection point to another. This is to achieve that a single decoupling capacitor can be used to decouple a large range of high-frequency components. However, in the triangular area of the capacitor electrodes described there, there are still resonances as was tested by means of a simulation. Furthermore, it is necessary for the capacitors described to be manufactured with very thin layers.

It is an object of the present invention to render a decoupling module available with which the decoupling of high-frequency signals takes place without appreciable resonance and which need not of necessity be manufactured with a thin-film process.

This object is achieved with a decoupling module of the type defined in the opening paragraph in that the second metallic layer comprises at least two surfaces of different size which are consecutively electrically connected between an input connection point and an output connection point, while two respective consecutive surfaces are connected to each other by only one conducting section. In the invention the total capacitor surface is divided into a plurality of parallel-arranged small capacitors, which leads to a significant improvement of the decoupling function while the disturbing resonances as against a single capacitor having the same total capacitance as the sum of the individual capacitances are canceled.

According to a preferred embodiment the surfaces are rectangular surfaces, thus capacitors are formed with rectangular or quadratic electrodes. It has been shown that according to one embodiment of the invention the dimension of a surface perpendicular to the propagation direction of the high-frequency signal can be up to twice the dimension of the surface in the propagation direction of the high-frequency signal without the transmission properties being changed significantly.

If the surfaces are quadratic or rectangular, it is advantageous if for each two surfaces the edge length of the first surface is an irrational multiple of the edge length of the second surface:

$$\frac{a}{b} \neq \frac{m}{n}, \quad (3)$$

where:
a is the edge length of the first surface;
b is the edge length of the second surface; and
m and n are natural numbers. This guarantees that no pair of two capacitors is resonant at the same frequency. In addition, the edge lengths of the electrode surfaces are to be selected such that the geometry-defined resonances are as much apart as possible.

Customarily, a multiple of surfaces is arranged on an available mounting surface of the dielectric layer, the arrangement of the surfaces advantageously being provided such that the size of the second metallic layer is maximized, so that the maximum possible capacitor surface and thus the maximum possible capacitance is available. This particularly means that not only the shortest way between input connection point and output connection point is covered by surfaces forming capacitor electrodes, but that the arrangement of surfaces may also be meandering, for example. Due to this maximum possible exhaustion of the available covering surface, also rectangular surfaces are preferred for the capacitor electrodes, although, basically, the invention would also work with circular, ellipsoidal, polygonal, etc. shapes.

Furthermore, it is possible to shift the low-frequency resonances which arise from the connection lines between the capacitors and the capacitors themselves (LC resonances), by suitably selecting the length and width of the connection lines in frequency ranges that need not be decoupled for the application. The higher the inductance of the conductive section, the lower the resonant frequencies.

For many applications it can be used to advantage that the layer can be made of dielectric material in a thick-film process. In a thick-film process the layer thicknesses are at least about 5 μm. To nevertheless realize a capacitor having a large capacitance, the dielectric material is to have high dielectric constant and, furthermore, the capacitor surface is to be selected as large as possible. The high dielectric constant induces a small wavelength in the material as a result of which the necessary larger dimension of the capacitor leads to resonances already at relatively low frequencies. With the invention it is possible to manufacture a decoupling capacitor also in a thick-film process, so that the advantages of an easy-to-make decoupling capacitor and integrability in a multilayer stack can be used. At dielectric constants of 1000 and over, the layer thicknesses are advantageously situated in the range from about 5 μm to about 20 μm.

According to a further advantageous embodiment of the invention, a further layer of dielectric material and a third metallic layer which is arranged as a further ground electrode of the decoupling module is disposed on the second metallic layer. This renders the double capacitance available with the same required surface.

The invention is applied in a multilayer stack comprising a multiple of ceramic layers which may also be manufactured according to the LTCC technology (Low Temperature Cofire Ceramics), of which at least one layer is a layer of dielectric material on whose one side is deposited a first metallic layer as a ground electrode which totally or partly covers the dielectric layer and on whose opposite side a second metallic layer of at least two surfaces of different size is deposited, which surfaces are electrically arranged on top of each other between an input connection point and an output connection point, while two consecutive surfaces are connected to each other by only one conducting section.

These and other aspects of the invention are apparent from and will be elucidated with reference to the embodiments described hereinafter.

DETAILED DESCRIPTION OF THE INVENTION

FIG. 1 shows in the partial diagram (a) in plan view a decoupling module which is produced with a single capacitor which was manufactured in a thick-film process. The capacitor surface is 4 mm$^2$, the layer thickness of the dielectric material 17 μm, the dielectric constant ε 1000. As can be seen in partial diagram (b), which illustrates the power transmission, resonances occur of which the first resonance corresponds to the power distribution in partial diagram (c) and the second resonance to the power distribution shown in partial diagram (d). For resonant frequencies which are already in the lower GHz range, the edge length a of a quadratic capacitor electrode is covered by multiples of the half wavelength of the high-frequency signal. This means:

$$a = \frac{\lambda}{2m} = \frac{\lambda_0}{2m\sqrt{\varepsilon_{e\!f\!f}}} = \frac{c_0}{2mf} \cdot \frac{1}{\sqrt{\varepsilon_{e\!f\!f}}}, \quad (4)$$

where
- $\lambda$ is the wavelength in the multilayer stack;
- $\lambda_0$ is the wavelength in air;
- $\varepsilon_{e\!f\!f}$ is the average/effective dielectric constant in the multilayer stack;
- $c_0$ is the speed of light in air;
- f is the high-frequency signal frequency;
- m is the resonance arrangement (1, 2, 3 . . . ).

These resonances are of great importance in thick-film decoupling modules because with the same capacitance, the capacitor surface is to be selected to be larger than with thin-film decoupling modules to compensate for the process-defined larger layer thickness. Furthermore, a high dielectric constant is to be selected to realize sufficient capacitance despite the large layer thicknesses. This dielectric constant induces a small wavelength in the material, as already observed, which leads to the undesired resonances.

Figure 1A:
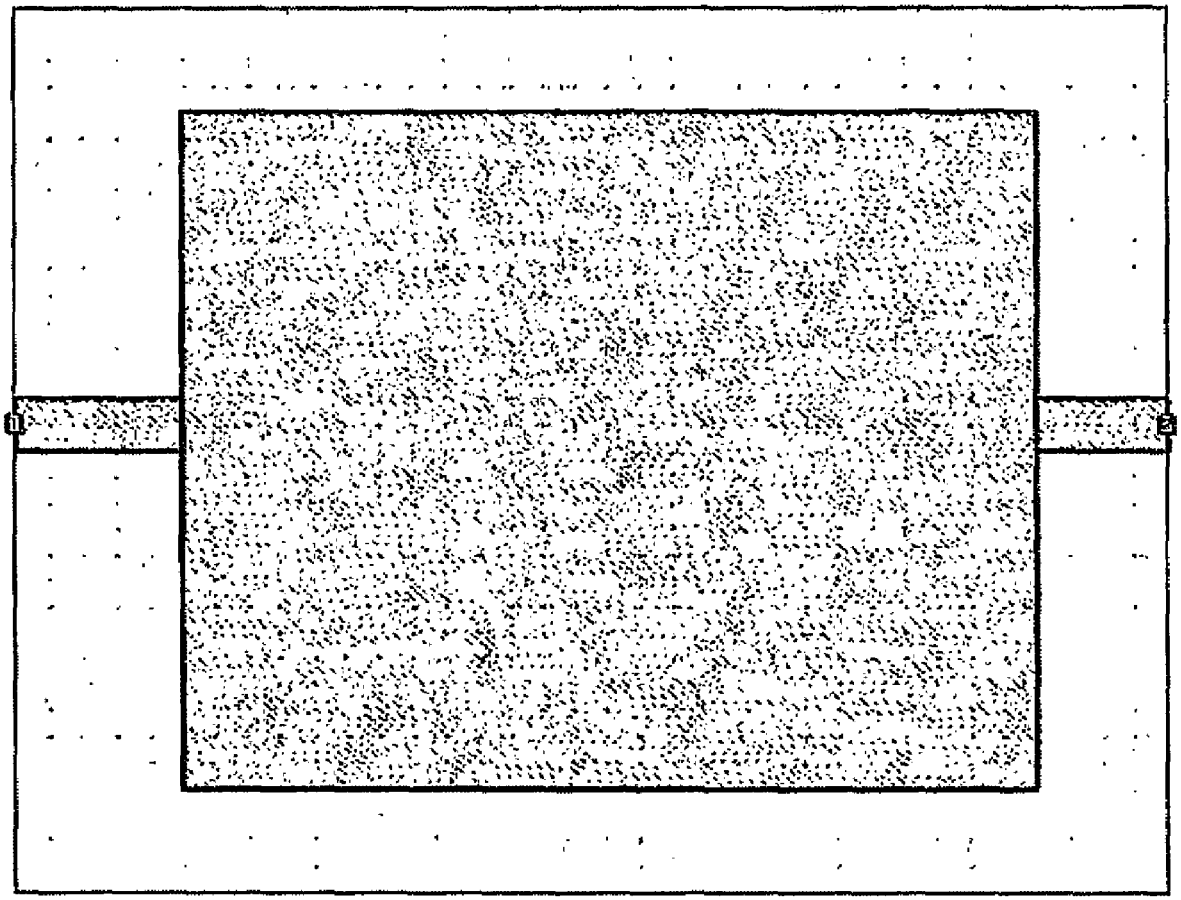
FIG. 1 shows in a partial diagram (a) a decoupling module which is arranged as a single capacitor, gives in partial diagram (b) a representation of the power transmission with geometry-defined resonances, in partial diagram (c) the power distribution at the 1.8 GHz resonant frequency and in partial diagram (d) the power distribution at the 3.6 GHz resonant frequency.
Figure 1B:
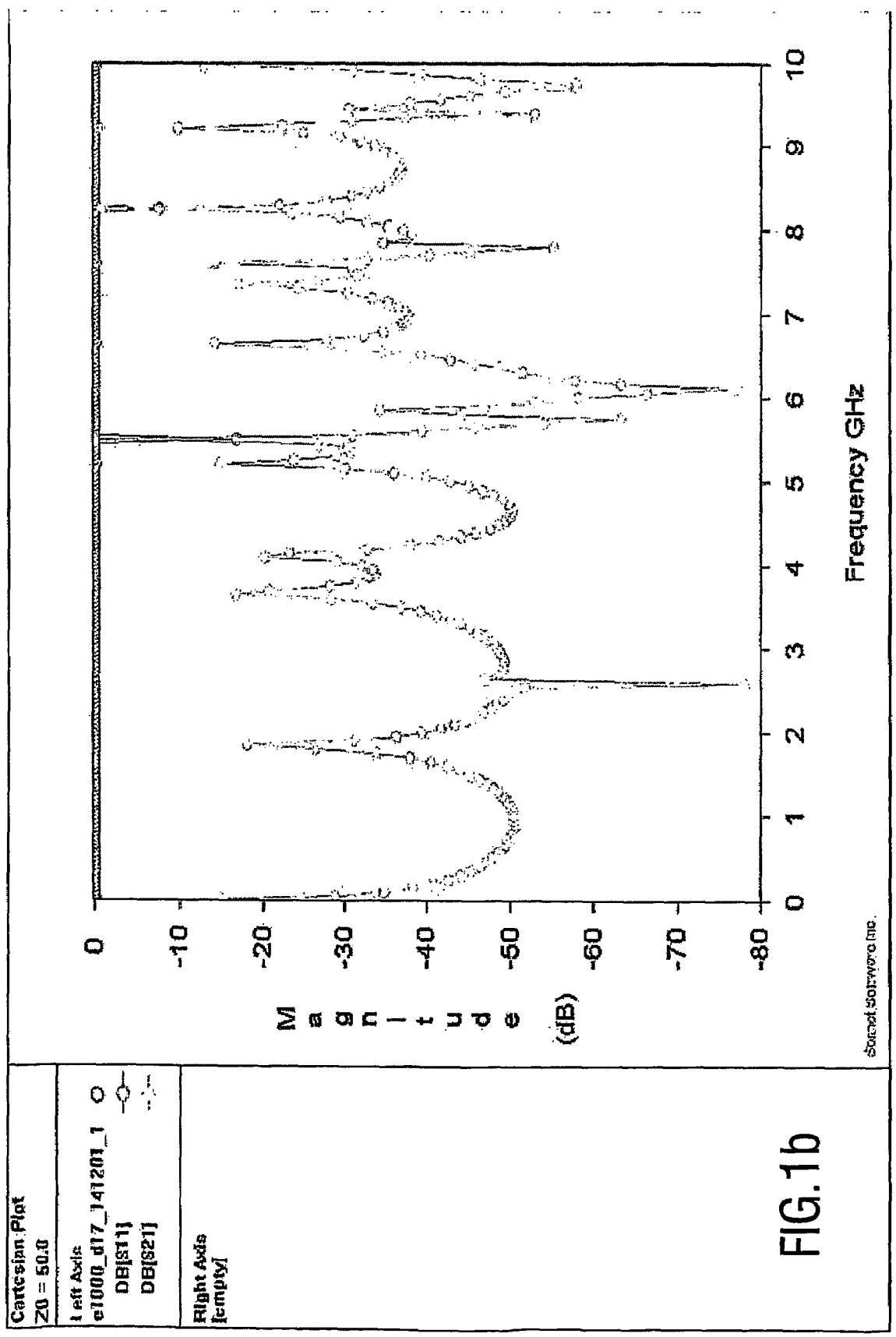
Figure 1C:
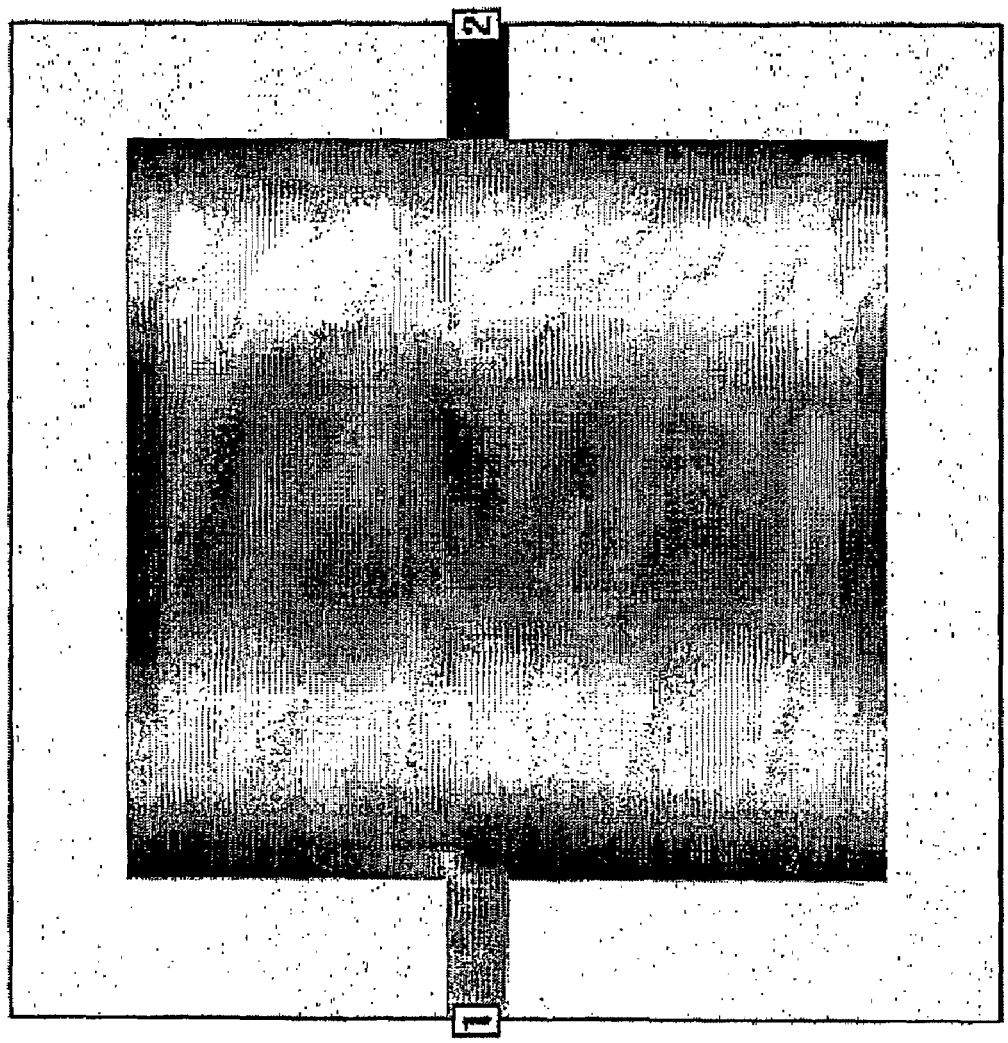
Figure 1C:
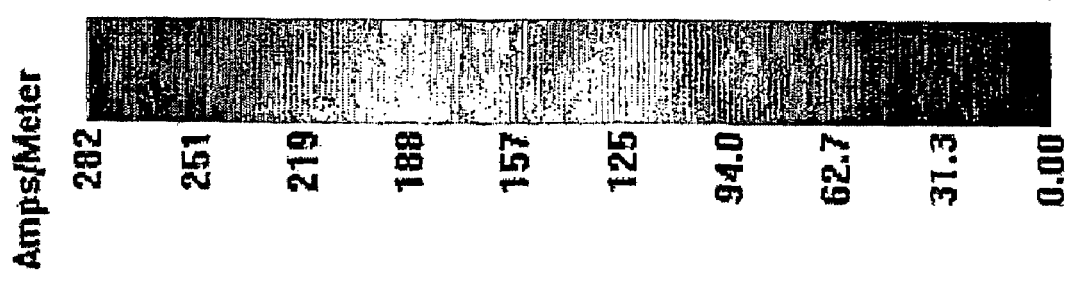
Figure 1D:
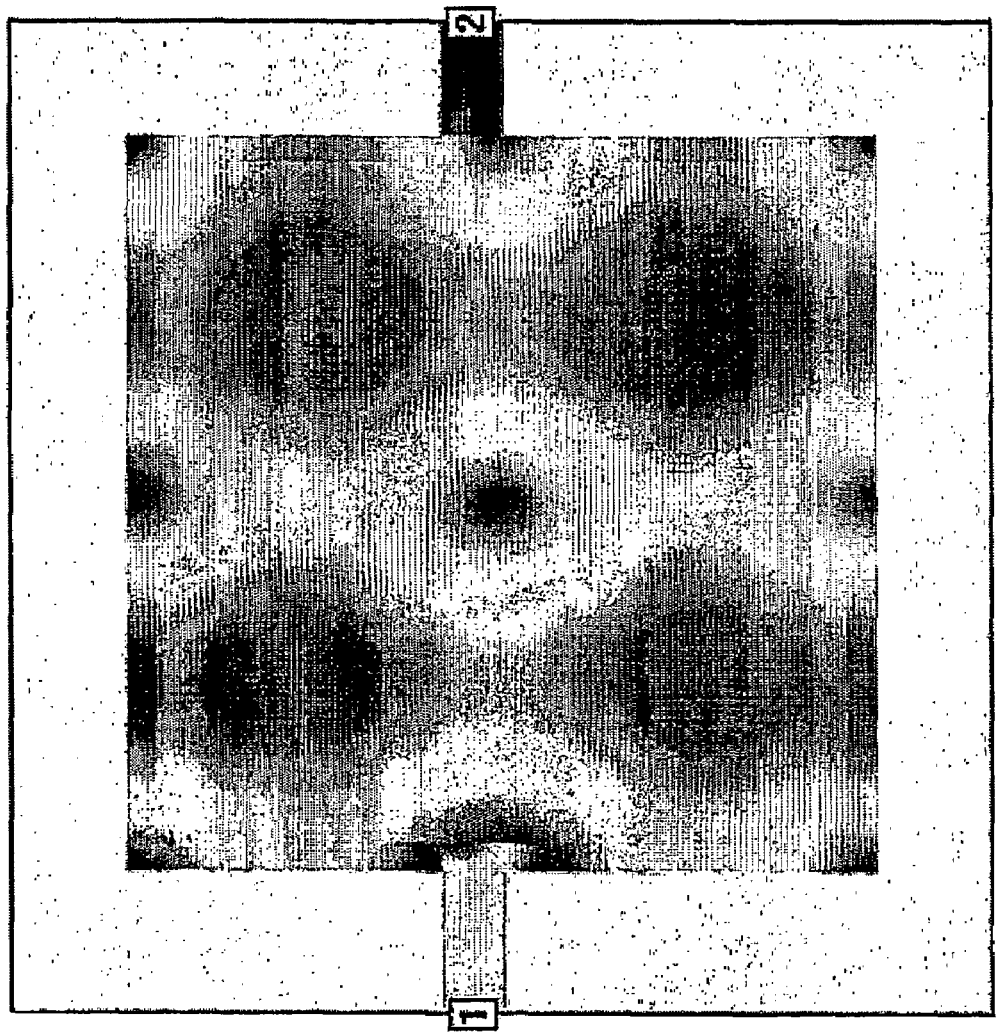
Figure 1D:
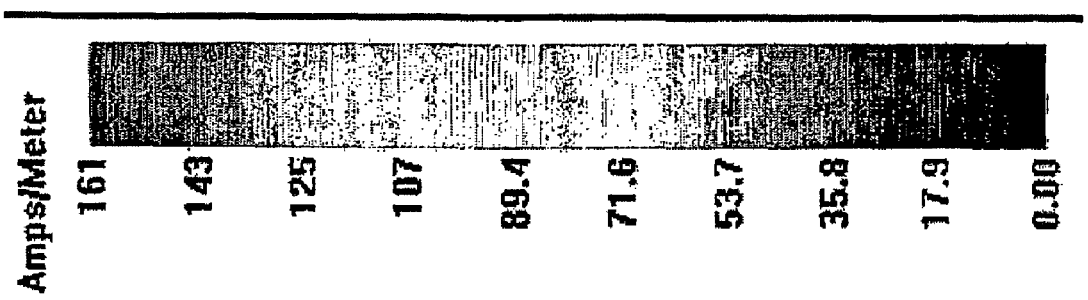
Figure 2:
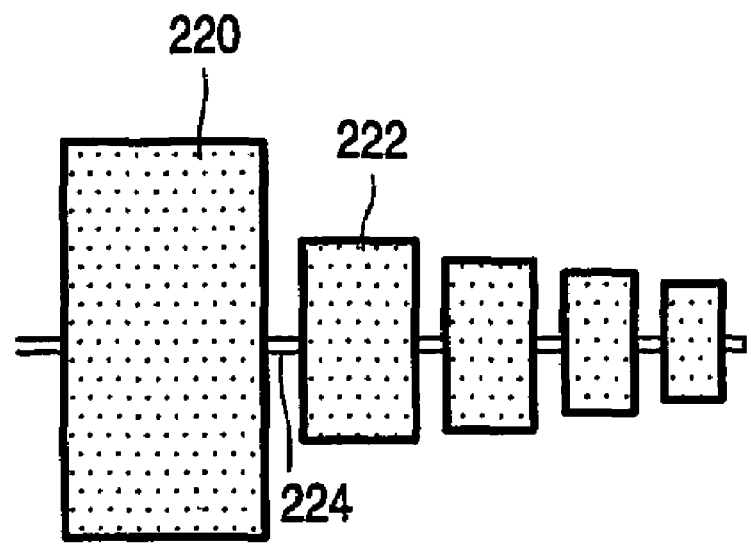
FIG. 2 shows a first embodiment of the surfaces forming the capacitor electrodes according to the present invention.
Figure 3:
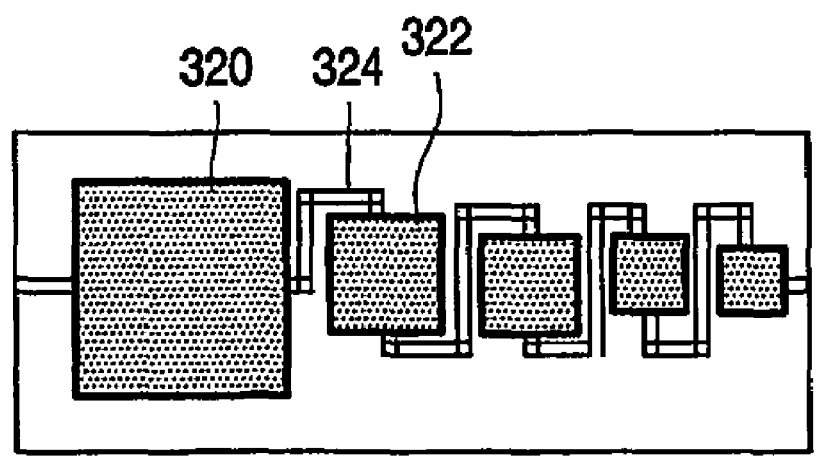
FIG. 3 shows a second embodiment of the surfaces forming the capacitor electrodes according to the invention.

FIGS. 2 and 3 show examples for the subdivision of the capacitor surface in accordance with the present invention, which leads to a significant improvement of the decoupling function. According to FIG. 2 rectangular capacitors, for example 220, 222 are consecutively electrically connected, while the length of the capacitors perpendicular to the direction of propagation of the high-frequency signal can be selected to be twice as long as the length in direction of propagation without the transmission properties being changed significantly. As a result, up to twice as large capacitance values can be achieved. The connection lines, for example 224, are kept shortest possible. FIG. 3 shows an electrode structure with quadratic surfaces of the capacitor electrodes, for example, 320, 322 while the connection lines, for example, 324 have an inductance adapted to the resonant frequency desired for them. It is not mandatory for the capacitor surfaces to diminish from input connection point to output connection point, rather the arrangement and size of the surfaces can be optimized so that the available mounting surface is utilized to its maximum.

Figure 4:
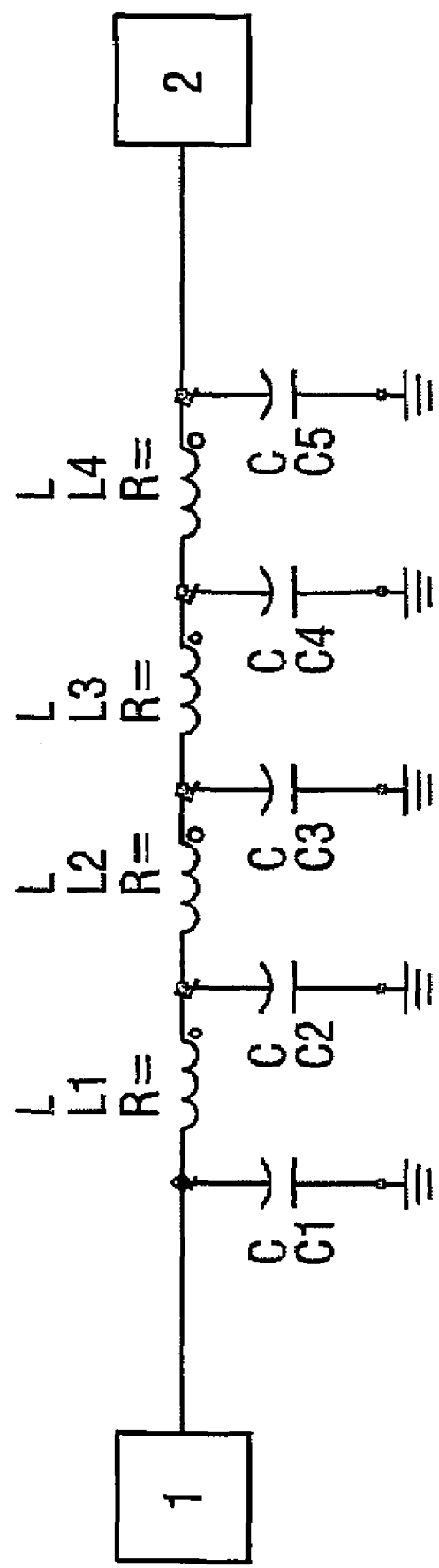
FIG. 4 shows the equivalent circuit diagram for the embodiments shown in FIGS. 2 and 3.
Figure 5A:
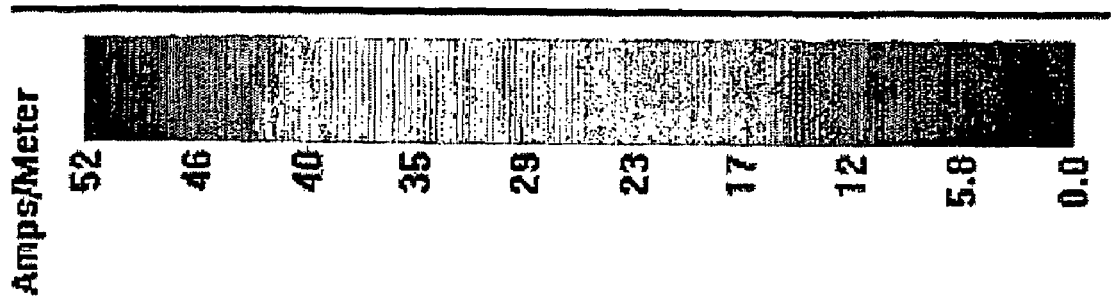
FIG. 5 shows in a partial diagram (a) the power distribution at the 2.4 GHz resonant frequency for the embodiment of a decoupling module shown in FIG. 3 and in partial diagram (b) the power distribution at the 4.8 GHz resonant frequency.
Figure 5A:
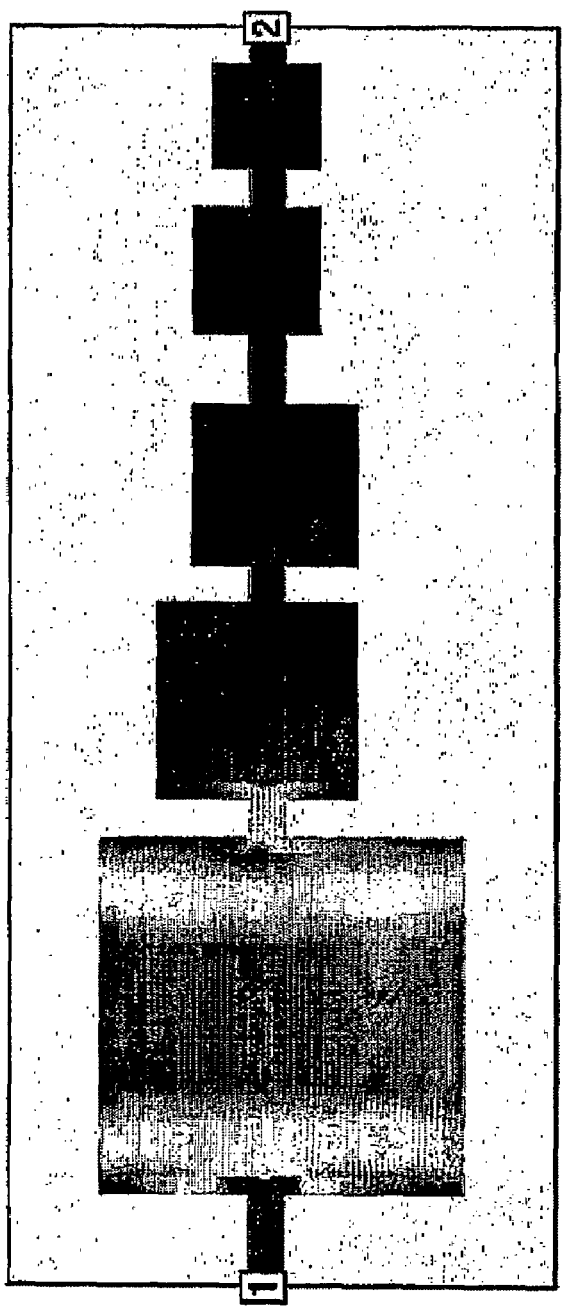
Figure 5B:
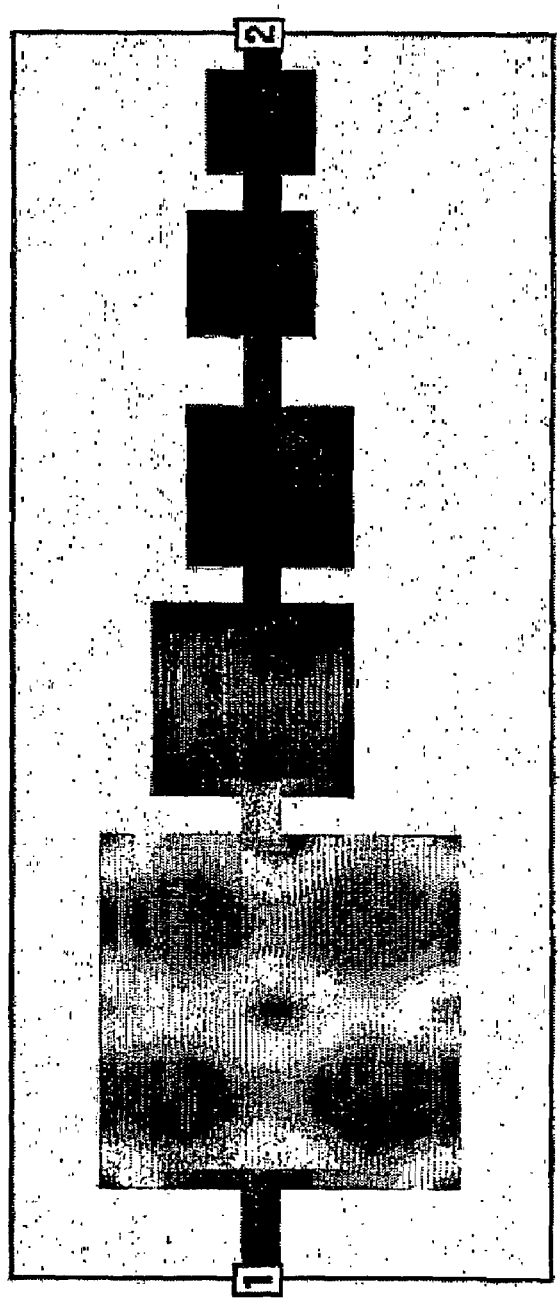
Figure 5B:
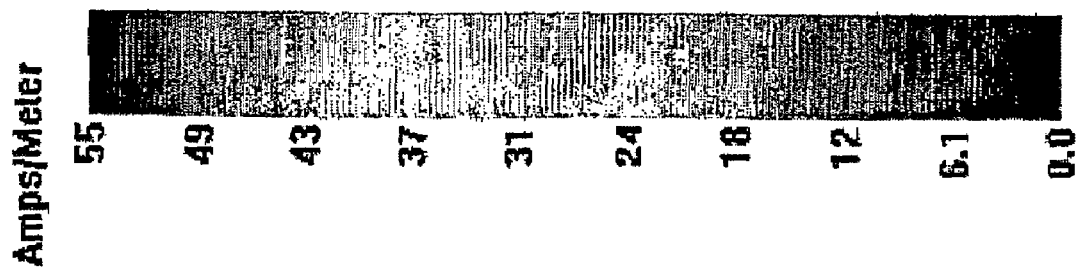

The structures of FIGS. 2 and 3 define a successive arrangement of a plurality of capacitors in parallel. The equivalent circuit diagram is shown in FIG. 4.

FIG. 5 shows in partial diagrams (a) and (b) the power distribution at the 2.4 GHz and 4.8 GHz resonant frequency respectively, for the decoupling module shown in FIG. 3. It is evident that with the resonance of the first capacitor the next capacitors are not yet resonant and can further work as decoupling capacitors.

Figure 6:
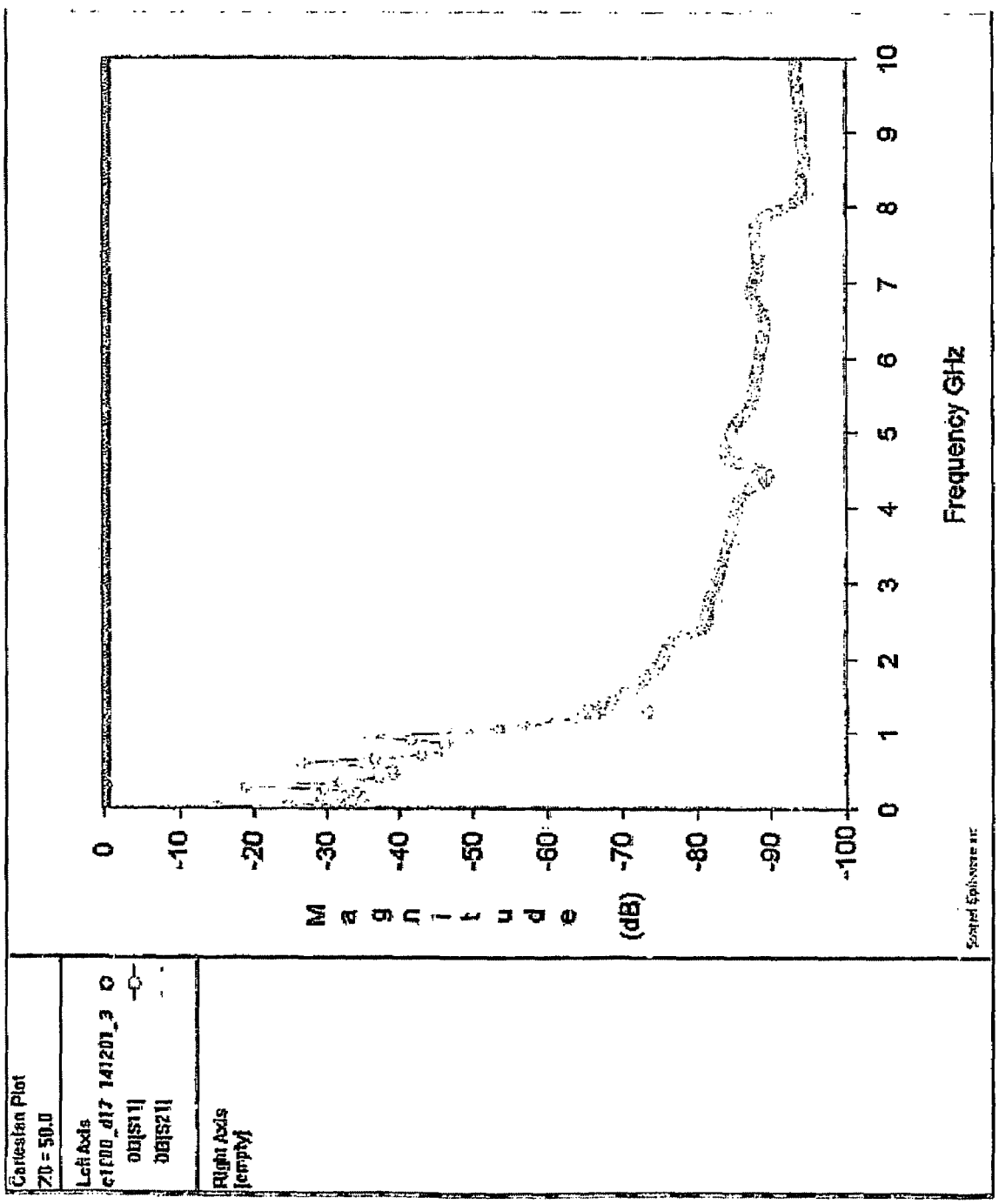
FIG. 6 gives a representation of the power transmission with a decoupling module in accordance with the embodiment shown in FIG. 3.

FIG. 6 shows in the graphic representation of the power transmission that no disturbing resonances occur any longer in the frequency range from 1 GHz to 10 GHz.

Figure 7:
FIG. 7 gives a diagrammatic representation of the arrangement of a further decoupling module in accordance with the present invention.

FIG. 7 shows a further embodiment of a decoupling module in accordance with the present invention. In a layer structure a first metallic layer 20 is applied as a ground electrode on a substrate 10, on top of the metallic layer a first layer 30 of dielectric material and a second layer 32 of dielectric material. Between the layers 30 and 32 there is a second metallic layer 22 with the surface arrangement of the capacitor electrodes, so that capacitors are connected not only to the first layer 30 of dielectric material and the first metallic layer 20, but also to the second layer 32 of dielectric material and the covering third metallic layer 24 which is connected as a ground electrode. In the embodiment shown the layer structure is terminated by a further substrate 12.

Figure 8:
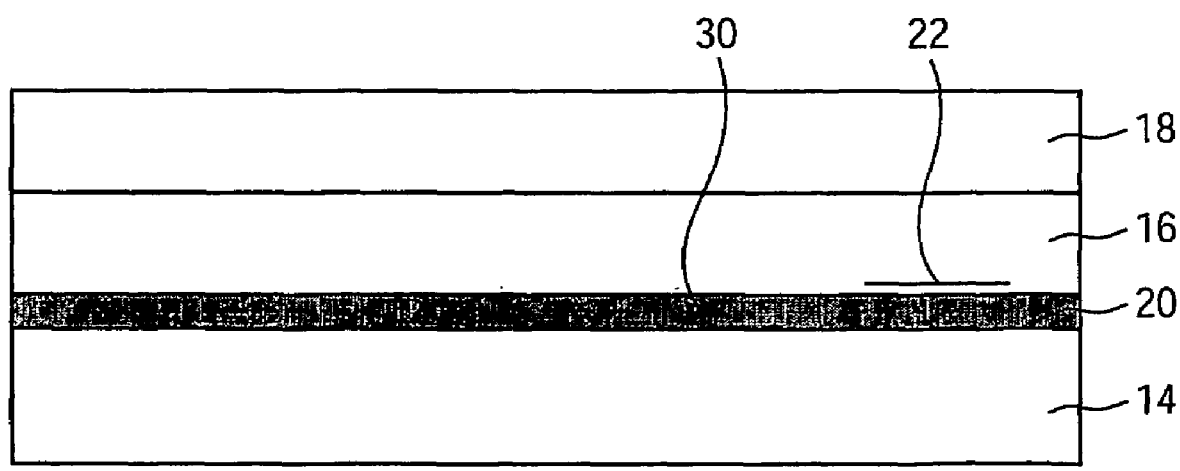
FIG. 8 gives a diagrammatic representation of the arrangement of a decoupling module in accordance with the present invention in a multilayer stack.

FIG. 8 shows in a diagram a multilayer stack comprising a plurality of ceramic layers 14, 16, 18 while a layer 30 of dielectric material having a high dielectric constant is arranged between the layer 14 and the layer 16. A first metallic layer 20 covers as a ground electrode the whole lower surface of the layer 30 of dielectric material. A second metallic layer 22 only partly covers the layer 30, so that the decoupling module is defined by this second metallic layer 22. The remaining part of the dielectric layer 30 can be utilized for further function structures.

Since the decoupling module according to the invention can be integrated in a multilayer stack, it is no longer necessary to mount discrete components on the circuit. This reduces both the cost of assembly and risk of errors.

The invention represents a possibility of manufacturing decoupling modules in a thick-film process. The greater layer thickness then makes it possible to utilize this type of decoupling modules at higher voltages. The dielectric field strength is only reached at several 100 volts. For example, a dielectric field strength of about 30 V/µm with layer thicknesses of about 15 µm leads to a breakdown voltage of 450 volts.

Basically, the invention provides that the complex thin-film processes for the decoupling function can be done without. However, the subdivision of the whole decoupling capacitance into a plurality of individual capacitances may also be an option for thin-film decoupling capacitors for high frequencies or high capacitance values. It is then also possible to compensate for the geometry-defined resonance at larger dimensions.

The invention claimed is:

1. A decoupling module for decoupling high-frequency signals from a power supply line, the module comprising a layer (30) of dielectric material which is arranged between a first and a second metallic layer (20, 22), the first metallic layer (20) being connected as a ground electrode of the decoupling module, characterized in that the second metallic layer (22) comprises at least two surfaces (220, 222; 320, 322) of different size which are consecutively electrically connected between an input connection point and an output connection point, while two respective consecutive surfaces are connected to each other by only one conducting section (224; 324).

2. A decoupling module as claimed in claim 1, characterized in that the surfaces are rectangular surfaces.

3. A decoupling module as claimed in claim 1, characterized in that the dimension of a surface (220) perpendicular to the direction of propagation of the high-frequency signal is up to twice the dimension of the surface in propagation direction of the high-frequency signal.

4. A decoupling module as claimed in claim 1, characterized in that the surfaces are quadratic surfaces (320, 322) while for each two surfaces the edge length of the first surface is an irrational multiple of the edge length of the second surface.

5. A decoupling module as claimed in claim 1, characterized in that with a predefined mounting surface of the layer (30) of dielectric material the arrangement of the surfaces is made so that the size of the second metallic layer (22) is maximized.

6. A decoupling module as claimed in claim 1, characterized in that the inductance of the conducting sections (224; 324) connecting the surfaces (220, 222; 320, 322) is selected so that their resonant frequency is situated below the carrier frequency of the high-frequency signal.

7. A decoupling module as claimed in claim 1, characterized in that the dielectric layer (30) is manufactured in a thick-film process.

8. A decoupling module as claimed in claim 1, characterized in that the layer (30) of dielectric material has a thickness from about 5 μm to about 20 μm.

9. A decoupling module as claimed in claim 1, characterized in that on the second metallic layer (22) are provided a further dielectric layer (32) and a third metallic layer (24) which is connected as a further ground electrode of the decoupling module.

10. A multilayer stack comprising a plurality of ceramic layers (14, 16, 18, 30), of which at least one layer is a layer (30) of dielectric material on whose one side a first metallic layer (20) is applied as ground electrode which fully or partly covers the layer (30) of dielectric material, characterized in that on the opposite side of the layer (30) a second metallic layer (22) of at least two surfaces of different size is provided which are consecutively electrically connected between an input connection point and an output connection point, while two respective consecutive surfaces (220, 222; 320, 322) are connected to each other by only one conducting section (224; 324).

* * * * *